United States Patent
Lim et al.

(10) Patent No.: US 10,468,234 B2
(45) Date of Patent: Nov. 5, 2019

(54) GAS MIXER AND SEMICONDUCTOR DEVICE FABRICATING APPARATUSES INCLUDING THE SAME

(71) Applicant: SAMSUNG ELECTRONICS CO., LTD., Suwon-si, Gyeonggi-do (KR)

(72) Inventors: Hongtaek Lim, Seoul (KR); Kangsoo Kim, Uiwang-si (KR); Hojun Kim, Seoul (KR); Jeonghoon Nam, Suwon-si (KR); Sejun Park, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 152 days.

(21) Appl. No.: 15/208,787

(22) Filed: Jul. 13, 2016

(65) Prior Publication Data
US 2017/0084471 A1   Mar. 23, 2017

(30) Foreign Application Priority Data
Sep. 18, 2015 (KR) .................. 10-2015-0132503

(51) Int. Cl.
*H01L 21/67* (2006.01)
*C23C 16/455* (2006.01)
*C23C 16/50* (2006.01)
*H01J 37/32* (2006.01)

(52) U.S. Cl.
CPC .... *H01J 37/3244* (2013.01); *C23C 16/45544* (2013.01); *C23C 16/50* (2013.01); *H01J 37/32009* (2013.01)

(58) Field of Classification Search
None
See application file for complete search history.

(56) References Cited

U.S. PATENT DOCUMENTS

| | | | |
|---|---|---|---|
| 2,274,459 A * | 2/1942 | Rauen | F01N 1/003 181/248 |
| 3,279,892 A * | 10/1966 | Kronacher | B01J 19/28 165/89 |
| 5,227,334 A | 7/1993 | Sandhu | |
| 5,741,547 A | 4/1998 | Akram et al. | |
| 6,300,255 B1 | 10/2001 | Venkataranan et al. | |
| 6,303,501 B1 * | 10/2001 | Chen | C23C 16/08 137/3 |
| 6,511,924 B2 | 1/2003 | Mukai et al. | |
| 7,009,298 B2 | 3/2006 | Sandhu et al. | |
| 7,183,197 B2 | 2/2007 | Won et al. | |
| 7,204,886 B2 | 4/2007 | Chen et al. | |
| 7,763,551 B2 | 7/2010 | Brcka et al. | |
| 8,871,654 B2 | 10/2014 | Kato et al. | |
| 9,023,693 B1 | 5/2015 | Lin et al. | |

(Continued)

FOREIGN PATENT DOCUMENTS

KR   10-0209373 B1   4/1999
KR   10-2011-0116731 A   5/2012

(Continued)

*Primary Examiner* — Jethro M. Pence
(74) *Attorney, Agent, or Firm* — Lee & Morse, P.C.

(57) ABSTRACT

A semiconductor device fabricating apparatus includes a gas mixer having an upper surface and a lower surface, each of the upper and lower surfaces has an elliptical plane, and a side surface connecting the upper and lower surfaces, a gas inlet pipe on an upper portion of the gas mixer, and a gas outlet pipe on a lower portion of the gas mixer.

18 Claims, 14 Drawing Sheets

(56) References Cited

U.S. PATENT DOCUMENTS

2010/0136216 A1    6/2010  Tsuei et al.
2011/0038222 A1*   2/2011  Ludwig ............... B01F 3/04269
                                                    366/102

FOREIGN PATENT DOCUMENTS

KR    10-2013-0080096 A    3/2014
KR    10-2015-0034452 A    4/2015

* cited by examiner

GAS MIXER AND SEMICONDUCTOR DEVICE FABRICATING APPARATUSES INCLUDING THE SAME

CROSS-REFERENCE TO RELATED APPLICATION

Korean Patent Application No. 10-2015-0132503, filed on Sep. 18, 2015, in the Korean Intellectual Property Office, and entitled: "Cam-Type Gas Mixer and Semiconductor Device Fabricating Apparatuses Including the Same," is incorporated by reference herein in its entirety.

BACKGROUND

1. Field

Embodiments relate to a gas mixer having elliptical upper and lower surfaces and a semiconductor device fabricating apparatus including the gas mixer.

2. Description of the Related Art

In order to form fine patterns of a semiconductor device, supplying a uniformly mixed gas onto a wafer has emerged as an important technical issue. However, it is very difficult to make the uniformly mixed gas, and entirely and uniformly supplying the mixed gas onto the wafer has also emerged as a new important technical issue.

SUMMARY

Embodiments provide an apparatus and method of supplying gas to a wafer, a chamber, or a shower head without eccentricity.

Embodiments provide a gas mixer configured to uniformly control a thickness of a deposited film formed on a wafer, and semiconductor device fabricating apparatuses including the gas mixer.

Embodiments provide a gas mixer configured to supply an etching gas to uniformly etch a deposited film formed on a wafer, and semiconductor device fabricating apparatuses including the gas mixer.

In accordance with an aspect of embodiments, a semiconductor device fabricating apparatus includes a gas mixer having an upper surface and a lower surface, each of the upper and lower surfaces has an elliptical plane, and a side surface connecting the upper and lower surfaces, a gas inlet pipe on an upper portion of the gas mixer, and a gas outlet pipe on a lower portion of the gas mixer.

A minimum diameter of the upper surface of the gas mixer may be greater than a maximum diameter of the gas inlet pipe.

A minimum diameter of the lower surface of the gas mixer may be greater than a maximum diameter of the gas outlet pipe.

A maximum diameter of the lower surface of the gas mixer may equal a minimum diameter of the upper surface of the gas mixer.

The upper surface and the lower surface of the gas mixer may have major axes in the same direction, respectively, and minor axes in the same direction, respectively.

The gas mixer may be horizontally rotatable around an axis extending through the gas inlet pipe or the gas outlet pipe.

The gas mixer may be rotatable by at least $\pi/2$ of a turn.

A vertical height of the gas mixer may be greater than a minimum diameter of the lower surface thereof and smaller than a maximum diameter of the lower surface thereof.

The gas inlet pipe may be vertically connected to the upper surface of the gas mixer.

The gas inlet pipe may include a main gas inlet pipe vertically connected to the upper surface of the gas mixer, and a branch gas inlet pipe horizontally connected to a side surface of the main gas inlet pipe.

The branch gas inlet pipe may include a first branch gas inlet pipe and a second branch gas inlet pipe connected to the main gas inlet pipe so as to face the first branch gas inlet pipe.

Each of the first branch gas inlet pipe and the second branch gas inlet pipe may include a main branch pipe and an elbow branch pipe, the main branch pipe of the first branch gas inlet pipe and the main branch pipe of the second branch gas inlet pipe are parallel to each other, and the elbow branch pipe of the first branch gas inlet pipe and the elbow branch pipe of the second branch gas inlet pipe face each other.

The branch gas inlet pipe may further include a third branch gas inlet pipe connected to the main branch pipe so as to be perpendicular to each of the first branch gas inlet pipe and the second branch gas inlet pipe.

The gas inlet pipe may include a vertical branch inlet pipe connected to an upper portion of the main gas inlet pipe.

The vertical branch inlet pipe may be connected to an external plasma generator.

The gas outlet pipe may be vertically connected to the lower surface of the gas mixer.

The apparatus may further include a plasma inlet pipe surrounding the gas outlet pipe.

The plasma inlet pipe may further surround the gas inlet pipe.

The plasma inlet pipe may further surround the gas mixer.

In accordance with another aspect of embodiments, a semiconductor device fabricating apparatus includes a gas mixer having a cam shape in a top view, a gas inlet pipe on an upper portion of the gas mixer, and a gas outlet pipe on a lower portion of the gas mixer.

The gas mixer may have a pot or bowl shape in a perspective view.

A circumference of the upper portion of the gas mixer may be greater than that of the lower portion thereof.

The gas mixer may be horizontally rotatable.

In accordance with yet another aspect of embodiments, a semiconductor device fabricating apparatus includes a gas mixer having an upper surface and a lower surface, each of the upper and lower surfaces having an elliptical shape in top view, and a side surface connecting the upper and lower surfaces, a gas inlet pipe connected to the upper surface of the gas mixer, and a gas outlet pipe connected to the lower surface of the gas mixer.

The upper surface of the gas mixer may be larger than the lower surface of the gas mixer, and the side surface is inclined between the upper and lower surfaces.

The gas mixer may be rotatable around an axis normal to both the upper and lower surfaces of the gas mixer.

The gas mixer may be rotatable around at least one of the gas inlet pipe and the gas outlet pipe.

A diameter of each of the gas inlet and outlet pipes may be smaller than a corresponding smallest diameter of the upper and lower surfaces.

In accordance with yet another aspect of embodiments, a semiconductor device fabricating apparatus includes a gas chamber, a susceptor in the chamber, a gas mixer on an upper portion of the chamber, the gas mixer including an upper surface and a lower surface, each of the upper and lower surfaces having an elliptical plane, and a side surface connecting the upper and lower surfaces, a gas inlet pipe on an upper portion of the gas mixer, and a gas outlet pipe on a lower portion of the gas mixer, and a gas discharging unit on a lower portion of the chamber.

The apparatus may further include a shower head between the chamber and the gas mixer, the gas outlet pipe connecting the gas mixer to the shower head.

The shower head may include an upper plate connected to the gas outlet pipe, and a lower plate having a plurality of through holes to supply gas into the chamber.

In accordance with still another aspect of embodiments, a method of fabricating a semiconductor device includes loading a wafer onto a susceptor inside a chamber, closing the chamber, supplying a mixed gas into the chamber through a gas mixer, such that a material layer is formed on the wafer, unloading the wafer outside of the chamber, moving the wafer to an inspecting apparatus and inspecting the material layer o the wafer, and horizontally rotating the gas mixer according to an inspection result.

The gas mixer may have an elliptical upper surface and an elliptical lower surface.

Supplying the mixed gas into the chamber may include supplying the mixed gas through a gas inlet pipe connected to an upper surface of the gas mixer and a gas outlet pipe connected to a lower surface of the gas mixer.

Horizontally rotating the gas mixer may include rotating the gas mixer rotates on the gas inlet pipe and the gas outlet pipe as a rotation axis by at least $\pi/2$ of a turn.

Supplying the mixed gas through the gas inlet pipe may include supplying the mixed gas through a vertical main gas inlet pipe and horizontal first and second branch gas inlet pipes connected to side surfaces of the main gas inlet pipe.

Supplying the mixed gas through the gas inlet pipe may further include supplying the mixed gas through a vertical branch gas inlet pipe connected to an upper portion of the main gas inlet pipe.

The gas mixer may rotate during supplying the mixed gas into the chamber and during formation of the material layer on the wafer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
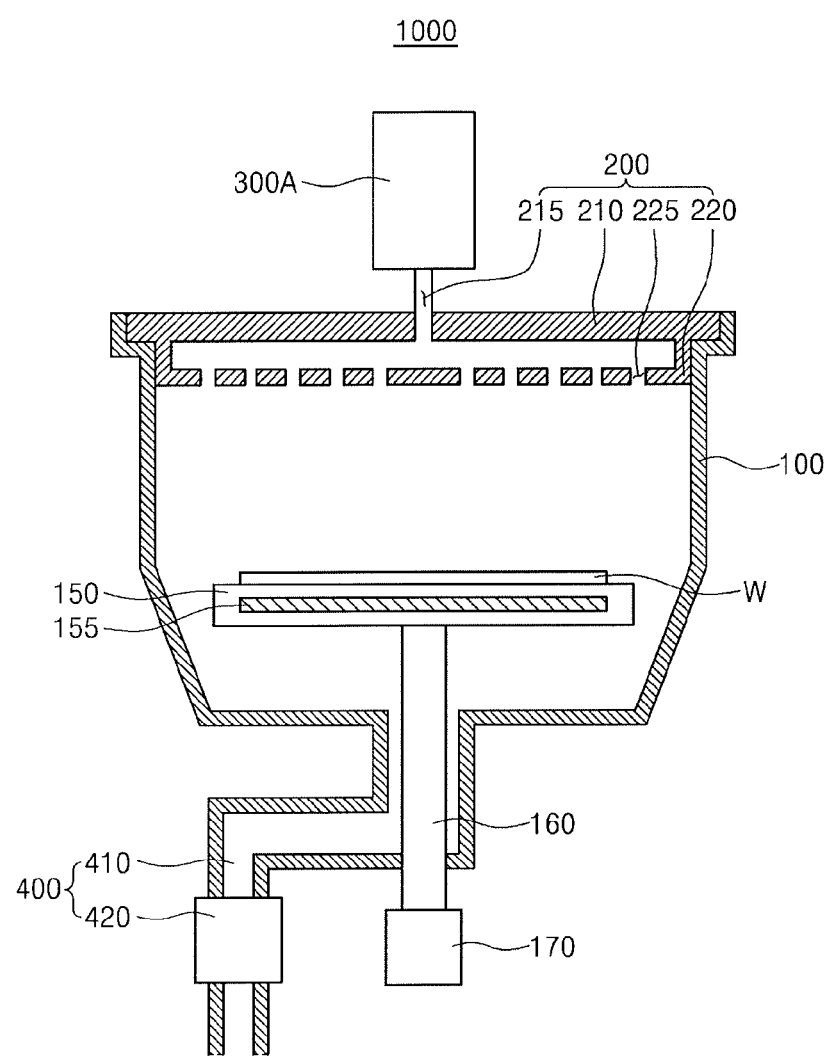
FIG. 1 illustrates a conceptual cross-sectional view of a semiconductor device fabricating apparatus in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Spatially relative terms, such as "below," "beneath," "lower," "above," "upper," and the like, may be used herein for ease of description in describing one element's or feature's relationship to another/other element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

FIG. 1 is a cross-sectional view conceptually illustrating a semiconductor device fabricating apparatus 1000 in accordance with an embodiment.

Referring to FIG. 1, the semiconductor device fabricating apparatus 1000 in accordance with an embodiment may include a chamber 100, a shower head 200 disposed on an upper portion of the chamber 100, a gas supply unit 300A disposed on the shower head 200, a susceptor 150 disposed inside the chamber 100, a supporter 160 disposed under the susceptor 150, and a gas discharging unit 400 disposed under the chamber 100.

The chamber 100 may be hermetically closed to make and maintain a vacuum state. A deposition process may be performed in the chamber 100.

The shower head 200 may be disposed on the upper portion of the chamber 100. The shower head 200 may receive a reaction gas, a purge gas, or other gases from the gas supply unit 300A to uniformly distribute and supply into an interior of the chamber 100. The shower head 200 may include an upper plate 210 with a gas supply hole 215 and a lower plate 220 with a plurality of through holes 225, e.g., the shower head 200 may include a circular upper plate 210 having a gas supply hole 215 in a center thereof, and a circular lower plate 220 having a plurality of through holes 225.

The gas supply unit 300A may supply various gases, microwaves, and/or plasma to the inside of the chamber 100 through the shower head 200. The gas supply unit 300A will be described in more detail with reference to other drawings.

A wafer W may be mounted on the susceptor 150. The susceptor 150 may have a heater 155 for heating the wafer W and the susceptor 150 thereinside. The heater 155 may include a heating coil, a heating plate, or a heating tube. In another embodiment, the susceptor 150 may further include a cooler for cooling the wafer W and the susceptor 150 thereinside.

The supporter 160 may rotate or move upward and downward the susceptor 150. The supporter 160 may be driven by an actuator 170. For example, the supporter 160 may have a cylindrical shape that can horizontally rotate, and the actuator 170 may include a motor.

The gas discharging unit 400 may include a gas discharging pipe 410 and a vacuum pump 420. The gas discharging unit 400 may be connected to a bottom of the chamber 100.

FIGS. 2A to 2D are a perspective view, top views, and side sectional views illustrating the gas supply unit 300A in accordance with an embodiment.

Figure 2A:
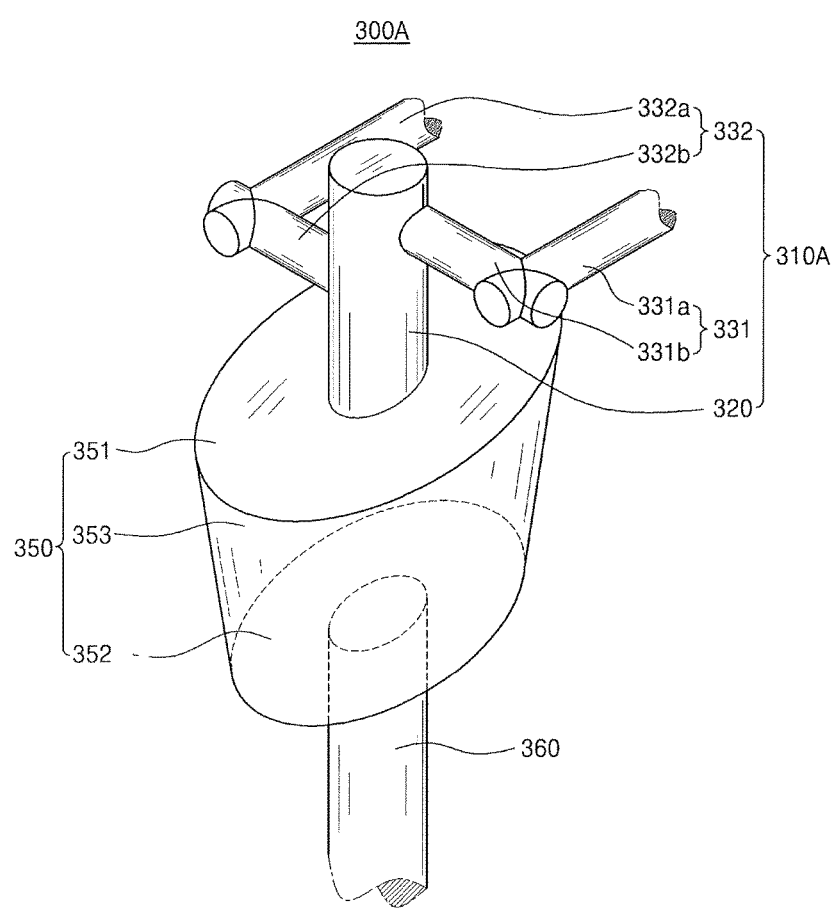
FIGS. 2A-2D, 3A-3B, and 4A-4F illustrate perspective views, top views, and side sectional views of a gas supply unit in accordance with an embodiment.

Referring to FIG. 2A, the gas supply unit 300A in accordance with an embodiment may include a gas inlet pipe 310A, a gas mixer 350, and a gas outlet pipe 360. The gas inlet pipe 310A may be connected to, e.g., a center of, an upper portion of the gas mixer 350, and the gas outlet pipe 360 may be connected to, e.g., a center of, a lower portion of the gas mixer 350.

The gas inlet pipe 310A may include a vertical main gas inlet pipe 320 and horizontal branch gas inlet pipes 331 and 332. The main gas inlet pipe 320 may have a vertical cylindrical shape. An upper portion of the main gas inlet pipe 320 may be closed or blocked, and a lower portion of the main gas inlet pipe 320 may be spatially connected to the gas mixer 350. The branch gas inlet pipes 331 and 332 may be spatially connected to side surfaces of the main gas inlet pipe 320. The branch gas inlet pipes 331 and 332 may include at least two branch gas inlet pipes 331 and 332. For example, the branch gas inlet pipes 331 and 332 may include the first branch gas inlet pipe 331 located at a relatively high level to be connected to the upper portion of the main gas inlet pipe 320, and the second branch gas inlet pipe 332 located at a relatively low level to be connected to the lower portion of the main gas inlet pipe 320.

The first branch gas inlet pipe 331 and the second branch gas inlet pipe 332 may include main branch pipes 331a and 332a, respectively, and elbow branch pipes 331b and 332b, respectively. For example, the main branch pipes 331a and 332a may be parallel to each other. The elbow branch pipes 331b and 332b may be perpendicular to respective main branch pipes 331a and 332a, and may be connected, e.g., directly, to the main gas inlet pipe 320 so as to face each other. In an embodiment, the first branch gas inlet pipe 331 may provide a source gas containing a source material, e.g., silane ($SiH_4$), to the main gas inlet pipe 320. The second branch gas inlet pipe 332 may provide a reactive gas containing a reactant, e.g., tetraethylorthosilicate (TEOS), to the main gas inlet pipe 320. In some embodiments, the first branch gas inlet pipe 331 may provide various gases, e.g., oxygen ($O_2$), nitrogen ($N_2$), ammonia ($NH_3$), and helium (He), to the main gas inlet pipe 320. The second branch gas inlet pipe 332 may provide an inert gas, e.g., helium ($H_2$), argon (Ar), or nitrogen ($N_2$), or a purge gas to the main gas inlet pipe 320. In some embodiments, the first branch gas inlet pipe 331 and/or the second branch gas inlet pipe 332 may provide a cleaning gas, e.g., nitrogen trifluoride ($NF_3$), to the main gas inlet pipe 320.

As discussed previously, the first branch gas inlet pipe 331 and the second branch gas inlet pipe 332 may be connected to opposite sides of the main gas inlet pipe 320, so gas flows from the first and second branch gas inlet pipes 331 and 332 may be directed toward each other in the main gas inlet pipe 320. When the first branch gas inlet pipe 331 and the second branch gas inlet pipe 332 introduce gases into the main gas inlet pipe 320 from opposite directions toward each other, the introduced gases may be more uniformly mixed in the main gas inlet pipe 320 and the gas mixer 350.

The gas mixer 350 may have a relatively large upper surface 351, a relatively small lower surface 352, and an inversely inclined side surface 353 connecting the upper surface 351 to the lower surface 352, e.g., the lower surface 352 may be smaller than the upper surface 351. For example, the gas mixer 350 may have an inverse conical shape having the elliptical upper surface 351 and lower surface 352. In another example, the gas mixer 350 may have a horizontal cam shape. Here, the cam shape means an asymmetric shape. For example, the cam shape may include a circle having an irregular diameter. In addition, the gas mixer 350 may have a circumference of an upper portion greater than that of the lower portion. The gas mixer 350 may have a closed pot or bowl shape.

The upper surface 351 and lower surface 352 of the gas mixer 350 each may have an elliptical shape in a top view. For example, the gas mixer 350 may have the upper surface 351 having an elliptical plane and the lower surface 352 having an elliptical plane. Since an internal volume of the gas mixer 350 is greater than those of the main gas inlet pipe 320 and the gas outlet pipe 360, the velocities of the gases received from the main gas inlet pipe 320 in the gas mixer 350 may be decreased. Therefore, the gases may be more uniformly mixed in the gas mixer 350 than in the main gas inlet pipe 320 and the gas outlet pipe 360.

The gas outlet pipe 360 may have a vertical cylindrical shape, and may be connected to the gas supply hole 215 of the upper plate 210 of the shower head 200. Referring again to FIG. 1, the gas outlet pipe 360 may supply the mixed gas from the gas mixer 350 to the shower head 200.

Figure 2B:
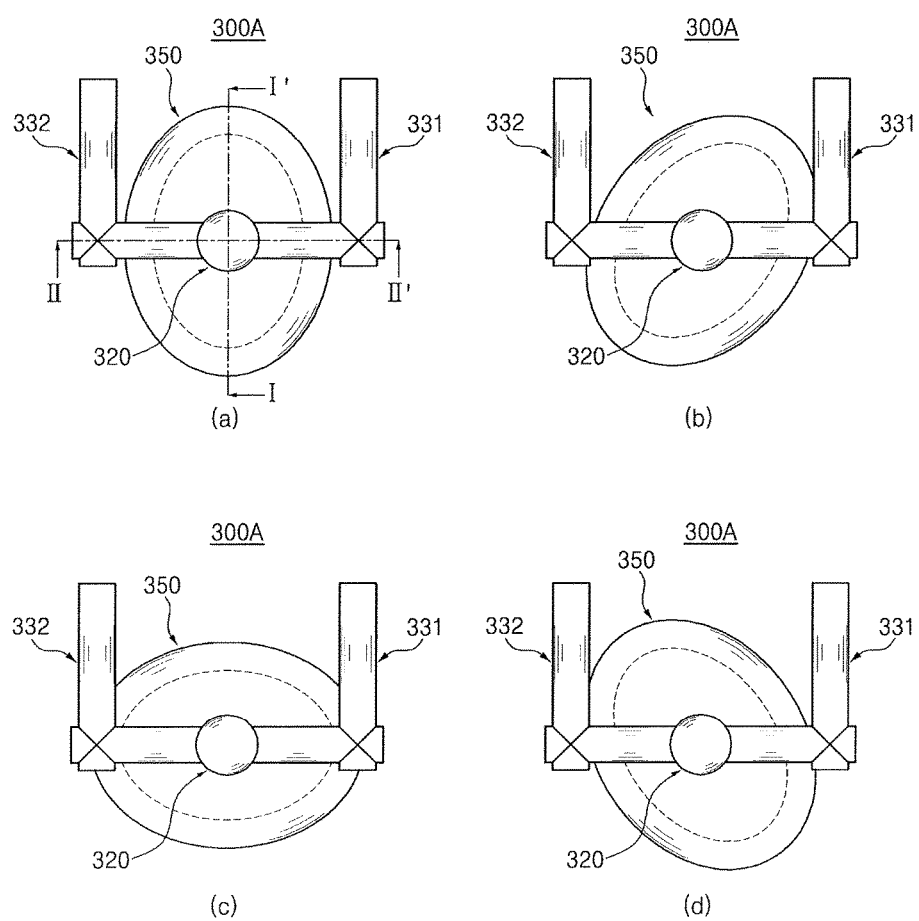

FIG. 2B illustrates top views of the gas mixer 350 of the gas supply unit 300A, which may rotate horizontally. Referring to FIGS. 2A and 2B(a)-2B(c), the gas mixer 350 of the gas supply unit 300A may rotate on the main gas inlet pipe 320 and/or the gas outlet pipe 360 as a rotation axis by at least $\pi/2$ of a turn, i.e., about 90°. For example, FIGS. 2B(a)-2B(c) illustrate that the gas mixer 350 rotates 0°, 45°, and 90°, respectively. In some extended embodiments, the gas mixer 350 may rotate 90° or more and $\pi$ (180°) or less. For example, FIG. 2B(d) illustrates that the gas mixer 350 rotates 135°. The gas mixer 350 may rotate in an opposite direction to the illustrated rotation direction.

The gas mixer 350 in accordance with the embodiment may prevent and reduce an eccentric, i.e., non-uniform, distribution phenomenon of the mixed gas from being generated. For example, when the mixed gas is supplied onto the shower head 200 or the wafer W, the horizontal rotation of the elliptical gas mixer 350, i.e., around an axis normal to the upper and lower surfaces 351 and 352, prevents and/or substantially reduces gas supply at an eccentric, i.e., non-uniform, pattern or deposition of a material layer in an eccentric shape, e.g., as compared to a gas mixer having a circular cross-section in top view.

Figure 2C:
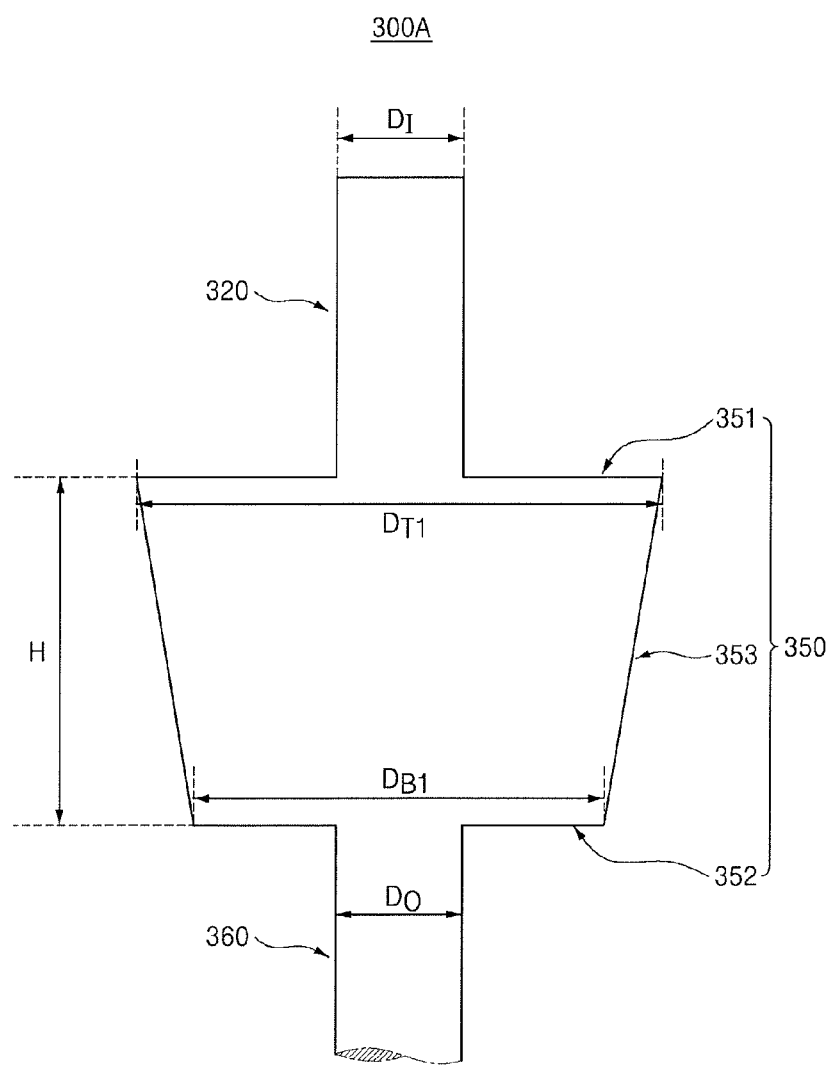
Figure 2D:
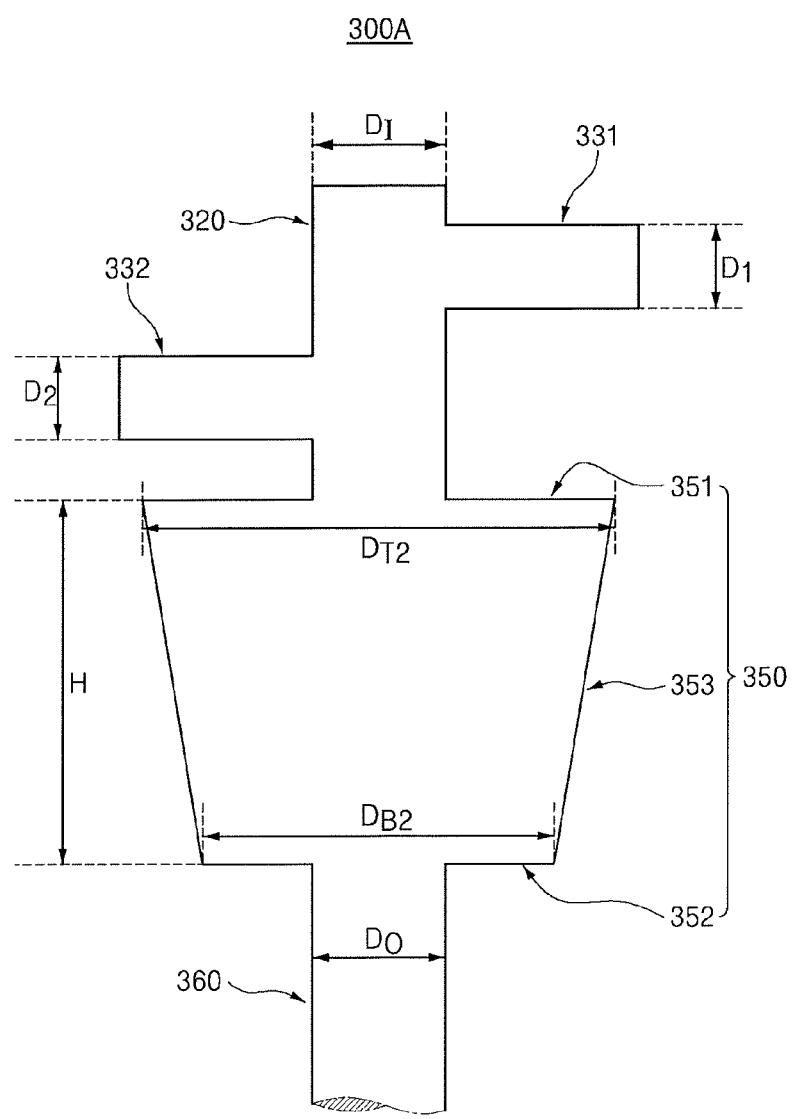

FIGS. 2C and 2D are side sectional views conceptually illustrating a shape of the gas mixer 350 of the gas supply unit 300A. For example, FIG. 2C is a longitudinal sectional view taken along line I-I' of FIG. 2B(a), and FIG. 2D is a longitudinal sectional view taken along line II-II' of FIG. 2B(a).

Referring to FIG. 2C, a maximum diameter $D_{T1}$ of the upper surface 351 of the gas mixer 350 may be greater than a maximum diameter $D_{B1}$ of the lower surface 352. For example, the maximum diameter $D_{T1}$ of the upper surface 351 may be about 1.1 times to about 1.5 times the maximum diameter $D_{B1}$ of the lower surface 352. As an example, in the drawing, it is illustrated that the maximum diameter $D_{T1}$ of the upper surface 351 is about 0.45 L and the maximum diameter $D_{B1}$ of the lower surface 352 is about 0.35 L (L will be described below).

A distance between the upper surface 351 and the lower surface 352, i.e., a vertical height H of the gas mixer 350, may be smaller than the maximum diameter $D_{B1}$ of the lower surface 352. For example, the vertical height H of the gas mixer 350 may be about 0.5 times to about 0.96 times the maximum diameter $D_{B1}$ of the lower surface 352. As an example, in the drawing, it is illustrated that the vertical height H is about 0.3 L. The maximum diameters $D_{T1}$ and $D_{B1}$ of the upper surface 351 and the lower surface 352 may be diameters of major axes, and minimum diameters $D_{T2}$ and $D_{B2}$ (FIG. 2D) may be diameters of minor axes. That is, the upper surface 351 and the lower surface 352 may have the maximum diameters $D_{T1}$ and $D_{B1}$, respectively, in the same major axis direction and the minimum diameters $D_{T2}$ and $D_{B2}$, respectively, in the same minor axis direction. The major axis direction and the minor axis direction may be perpendicular to each other. For example, the maximum diameters $D_{T1}$ and $D_{B1}$ and the minimum diameters $D_{T2}$ and $D_{B2}$ may be perpendicular to each other.

Referring to FIG. 2D, the minimum diameter $D_{T2}$ of the upper surface 351 of the gas mixer 350 may be greater than the minimum diameter $D_{B2}$ of the lower surface 352. For example, the minimum diameter $D_{T2}$ of the upper surface 351 may be about 1.1 times to about 1.5 times the minimum diameter $D_{B2}$ of the lower surface 352. As an example, in the drawing, it is illustrated that the minimum diameter $D_{T2}$ of the upper surface 351 is about 0.35 L, and the minimum diameter $D_{B2}$ of the lower surface 352 is about 0.25 L. In an embodiment, the minimum diameter $D_{T2}$ of the upper surface 351 may be the same as the maximum diameter $D_{B1}$ of the lower surface 352.

The distance between the upper surface 351 and the lower surface 352, i.e., the vertical height H of the gas mixer 350, may be smaller than the maximum diameter $D_{B1}$ of the lower surface 352. For example, the vertical height H of the gas mixer 350 may be about 0.5 times to about 0.96 times the maximum diameter $D_{B1}$ of the lower surface 352. As an example, in the drawing, it is illustrated that the vertical height H is about 0.3 L. In an embodiment, the vertical height H of the gas mixer 350 may be smaller than the maximum diameter $D_{B1}$ of the lower surface 352 and greater than the minimum diameter $D_{B2}$ of the lower surface 352.

A diameter $D_I$ of the main gas inlet pipe 320, a diameter $D_O$ of the gas outlet pipe 360, a diameter $D_1$ of the first branch gas inlet pipe 331, and a diameter $D_2$ of the second branch gas inlet pipe 332 may be changed according to the gas and the process. Referring to FIGS. 2C and 2D, an internal volume of the upper portion of the gas mixer 350 may be smaller than an internal volume of the lower portion thereof. In the present embodiment, as an example, it is assumed and illustrated that the diameter $D_I$ of the main gas inlet pipe 320 and the diameter $D_O$ of the gas outlet pipe 360 are the same as each other, and the diameter $D_1$ of the first branch gas inlet pipe 331 and the diameter $D_2$ of the second branch gas inlet pipe 332 are the same as each other.

For example, the gas supply unit 300A may have the following relational expression.

D: a diameter of the gas pipe

L: an introduction length $(1.395D(Re)^{0.25})$ (empirical formula)

Re: Reynolds number (Re=ρvd/η, ρ: density of fluid, v: velocity of fluid, d: diameter of fluid path, and η=viscosity of fluid)

The gas mixer 350 may have the following values.

The maximum diameter $D_{T1}$ of the upper surface 351: 0.45 L

The minimum diameter $D_{T2}$ of the upper surface 351: 0.35 L

The maximum diameter $D_{B1}$ of the lower surface 352: 0.35 L

The minimum diameter $D_{B2}$ of the lower surface 352: 0.25 L

The vertical height H: 0.3 L

Figure 3A:
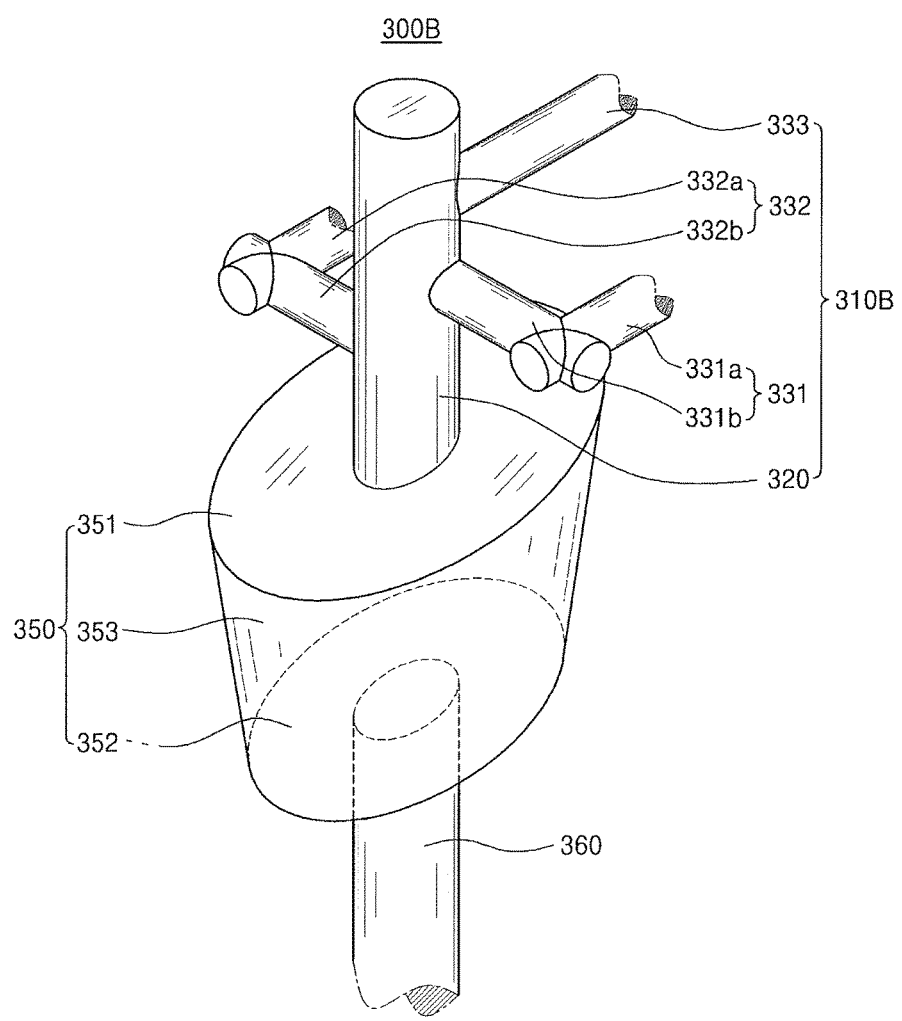
Figure 3B:
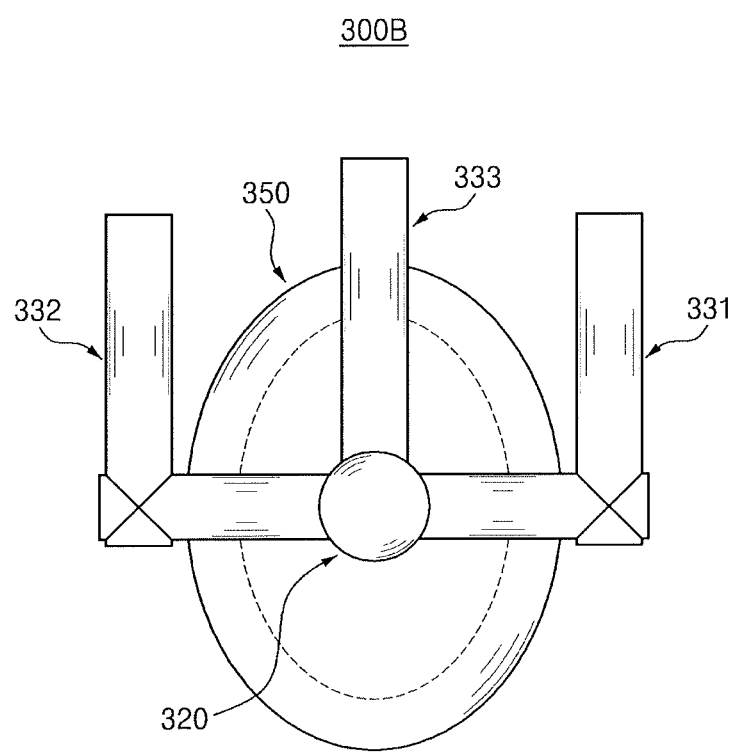

FIGS. 3A and 3B are a perspective view and a top view illustrating a gas supply unit 300B in accordance with another embodiment.

Referring to FIGS. 3A and 3B, a gas inlet pipe 310B of the gas supply unit 300B in accordance with an embodiment may further include a third branch gas inlet pipe 333 compared to the gas inlet pipe 310A described with reference to FIGS. 2A to 2D. The third branch gas inlet pipe 333 may be connected to the main gas inlet pipe 320 so as to be perpendicular to the elbow branch pipe 331b of the first branch gas inlet pipe 331 and the elbow branch pipe 332b of the second branch gas inlet pipe 332 in a top view. The first to third branch gas inlet pipes 331 to 333 may be located at different heights from each other to be connected to the main gas inlet pipe 320. In an embodiment, the third branch gas inlet pipe 333 may be directly and linearly connected to the main gas inlet pipe 320.

FIGS. 4A to 4F are perspective views illustrating gas supply units 300C to 300H in accordance with embodiments.

Figure 4A:
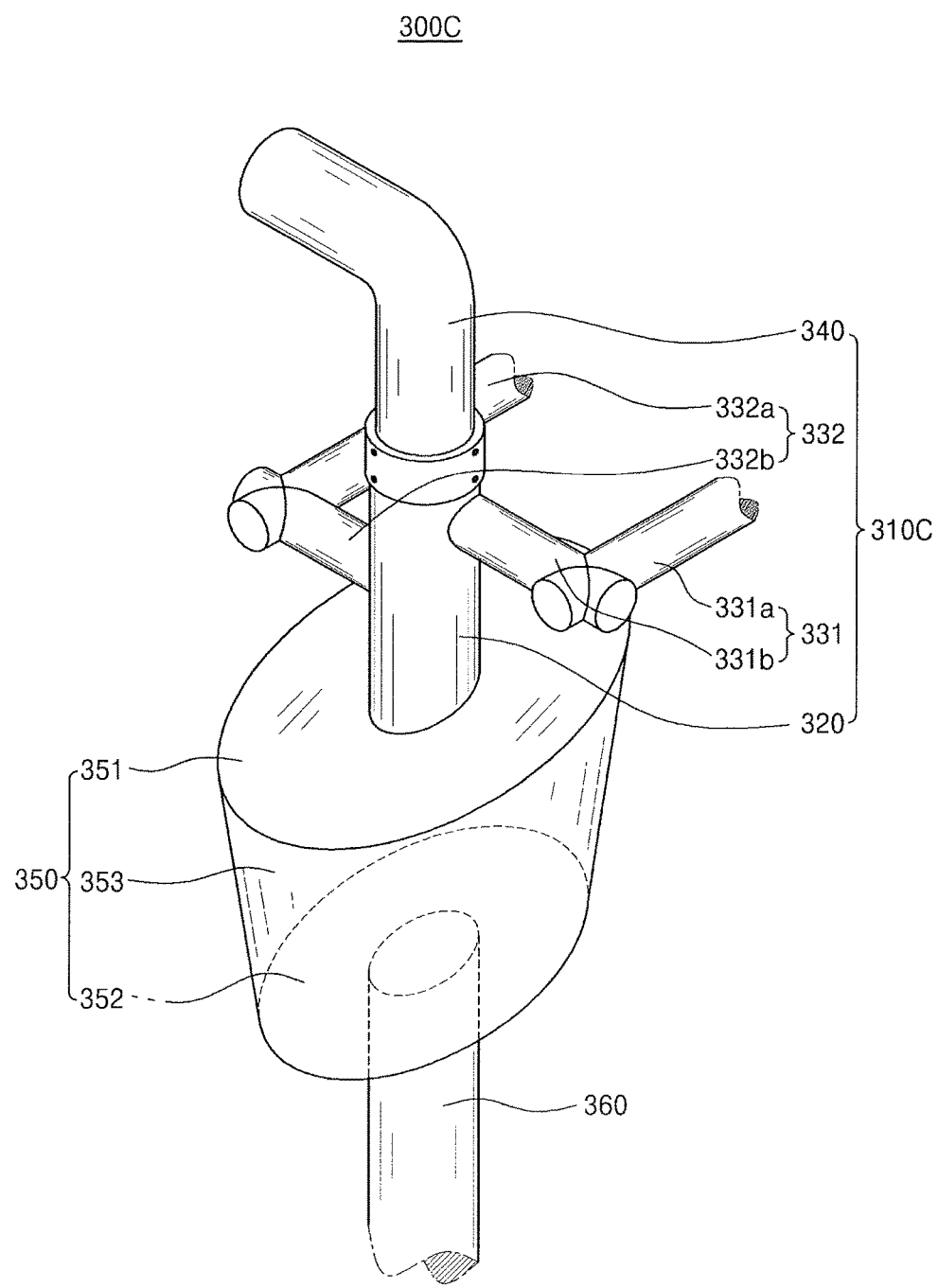

Referring to FIG. 4A, a gas inlet pipe 310C of the gas supply unit 300C in accordance with an embodiment may further include a vertical branch gas inlet pipe 340 connected to an upper portion of the main gas inlet pipe 320 compared to the gas inlet pipe 310A described with reference to FIGS. 2A to 2D. The vertical branch gas inlet pipe 340 may supply a carrier gas, a purge gas, a cleaning gas, or remote plasma to the upper portion of the main gas inlet pipe 320. The vertical branch gas inlet pipe 340 may be spatially connected to an external carrier gas tank, purge gas tank, cleaning gas tank, or plasma generator. Referring to FIG. 4A, the vertical branch gas inlet pipe 340 may be directly connected to the upper portion of the main gas inlet pipe 320.

Figure 4B:
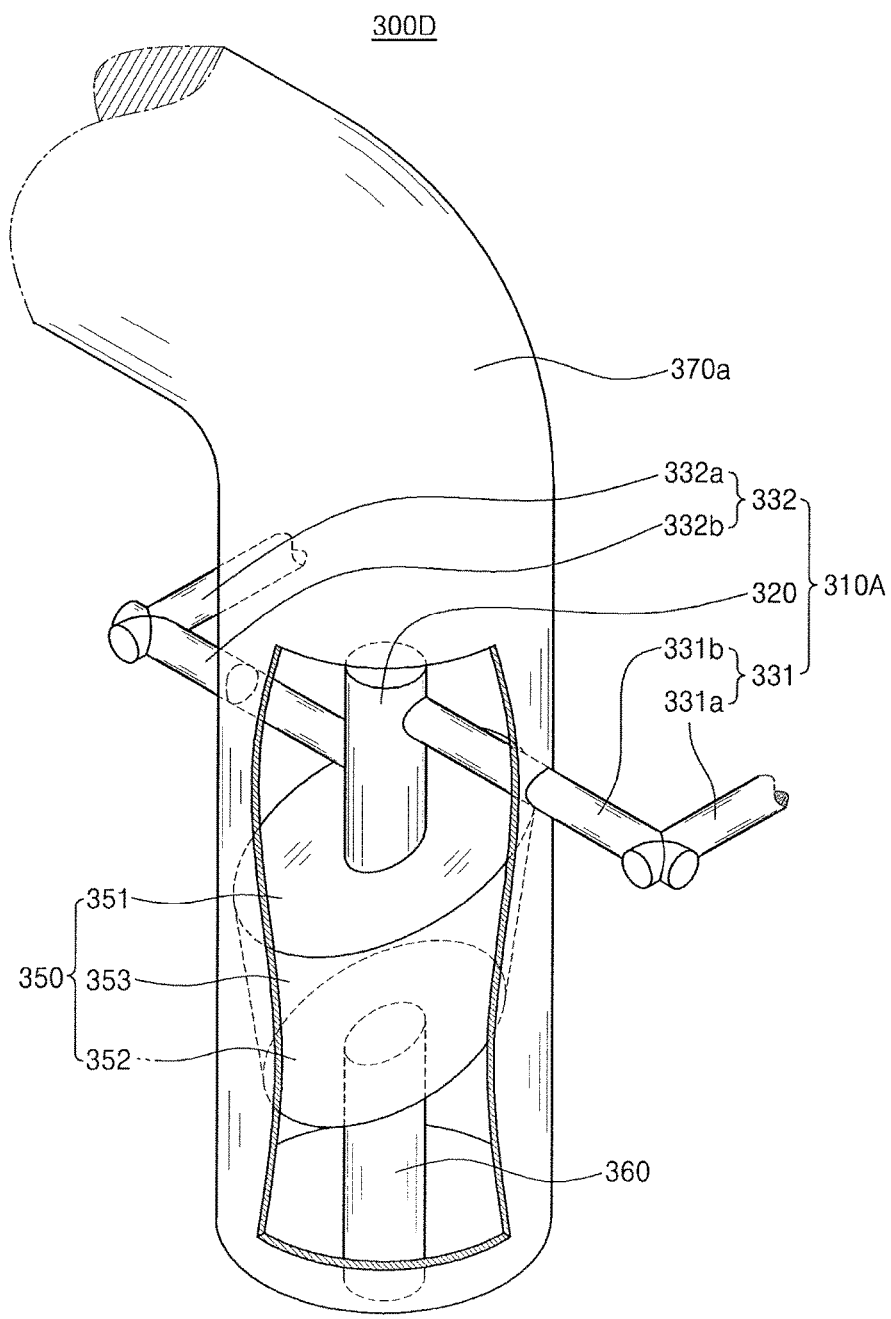

Referring to FIG. 4B, the gas supply unit 300D in accordance with an embodiment may further include a plasma inlet pipe 370a which surrounds the gas inlet pipe 310A, the gas mixer 350, and the gas outlet pipe 360 compared to the gas supply unit 300A described with reference to FIGS. 2A to 2D. The plasma inlet pipe 370a may provide remote plasma from the outside to the shower head 200 disposed on the chamber 100.

Figure 4C:
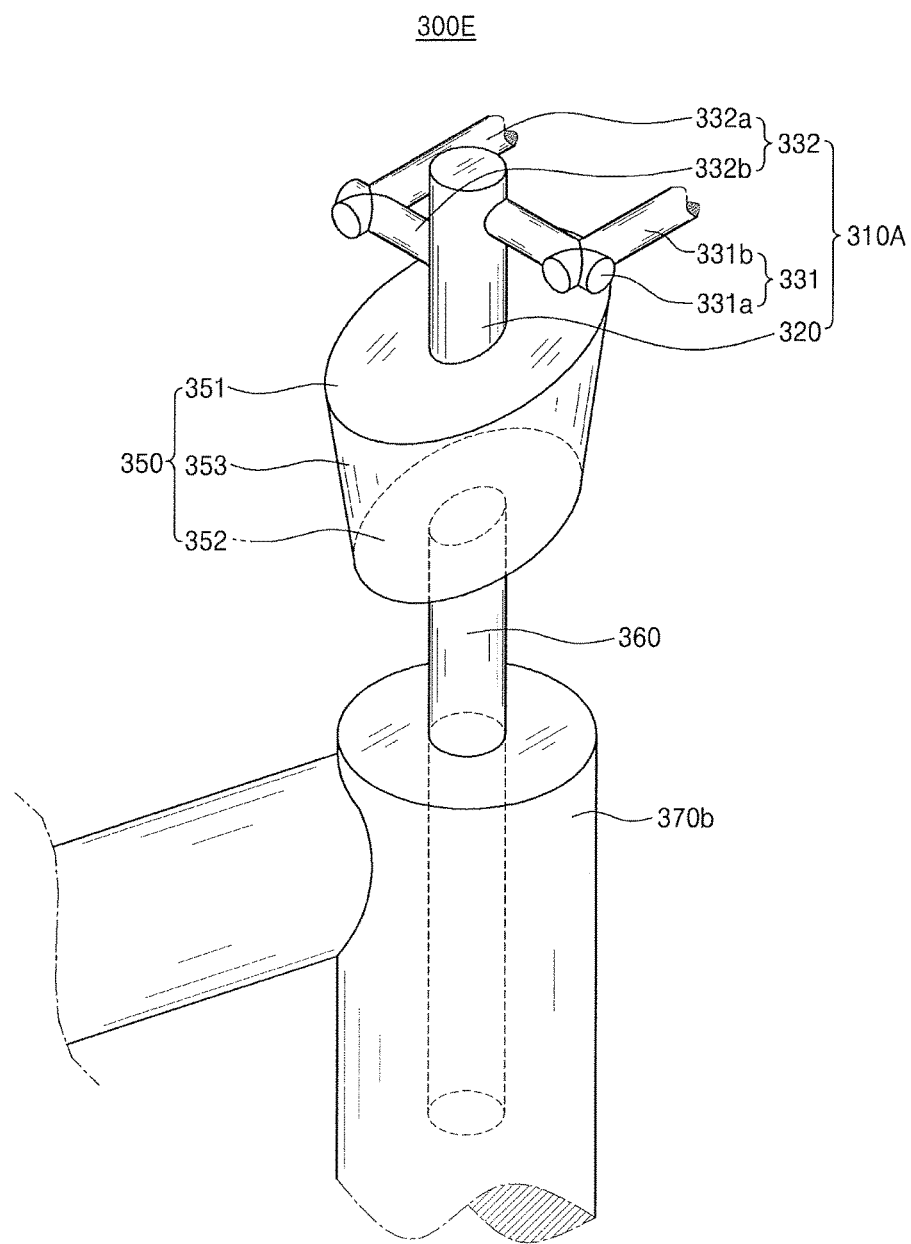

Referring to FIG. 4C, the gas supply unit 300E in accordance with an embodiment may further include a plasma inlet pipe 370b which surrounds the gas outlet pipe 360 compared to the gas supply unit 300A described with reference to FIGS. 2A to 2D. The plasma inlet pipe 370b may provide remote plasma from the outside to the shower head 200 disposed on the chamber 100.

Figure 4D:
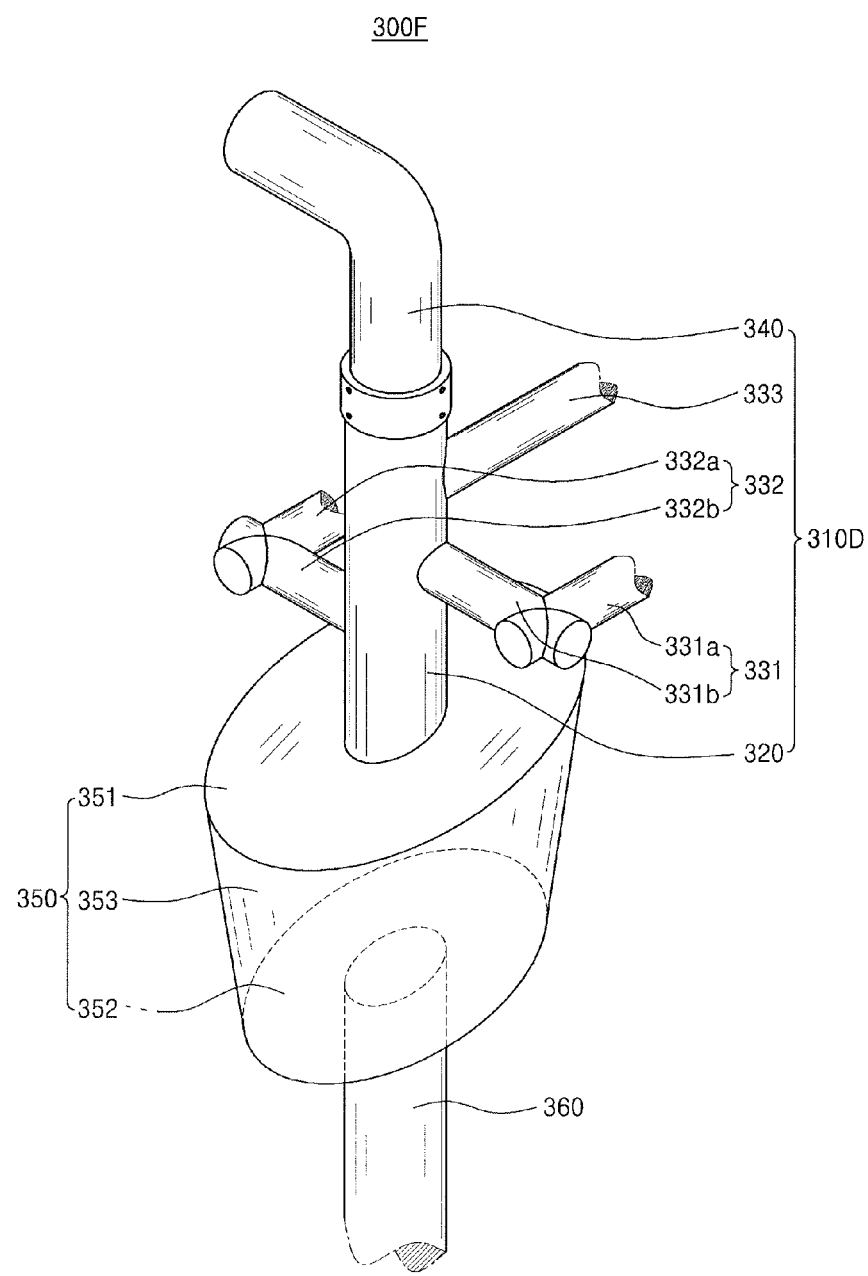

Referring to FIG. 4D, a gas inlet pipe 310D of the gas supply unit 300F in accordance with an embodiment may further include the vertical branch gas inlet pipe 340 connected to the upper portion of the main gas inlet pipe 320 compared to the gas inlet pipe 310B of the gas supply unit 300B described with reference to FIGS. 3A and 3B.

Figure 4E:
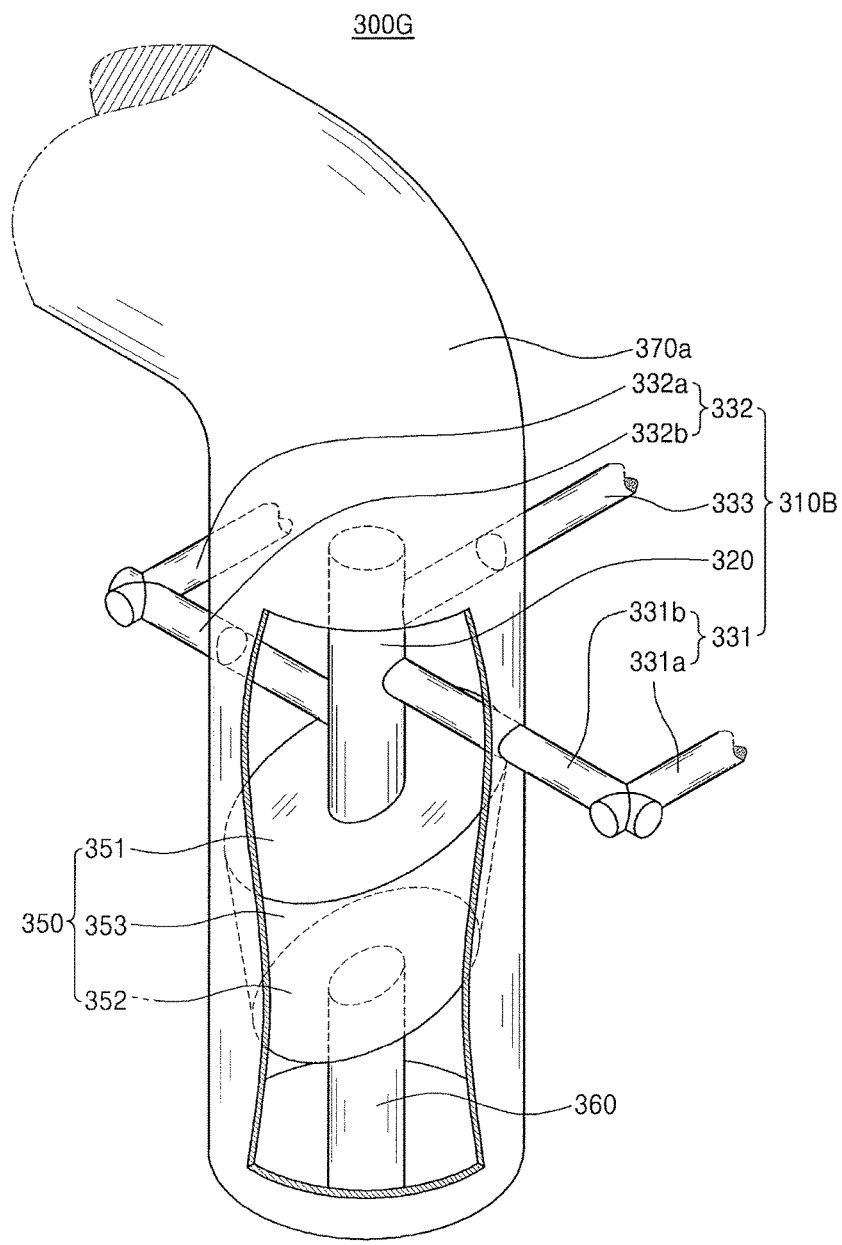

Referring to FIG. 4E, the gas supply unit 300G in accordance with an embodiment may further include the plasma inlet pipe 370a which surrounds the gas inlet pipe 310B, the gas mixer 350, and the gas outlet pipe 360 compared to the gas supply unit 300B described with reference to FIGS. 3A and 3B.

Figure 4F:
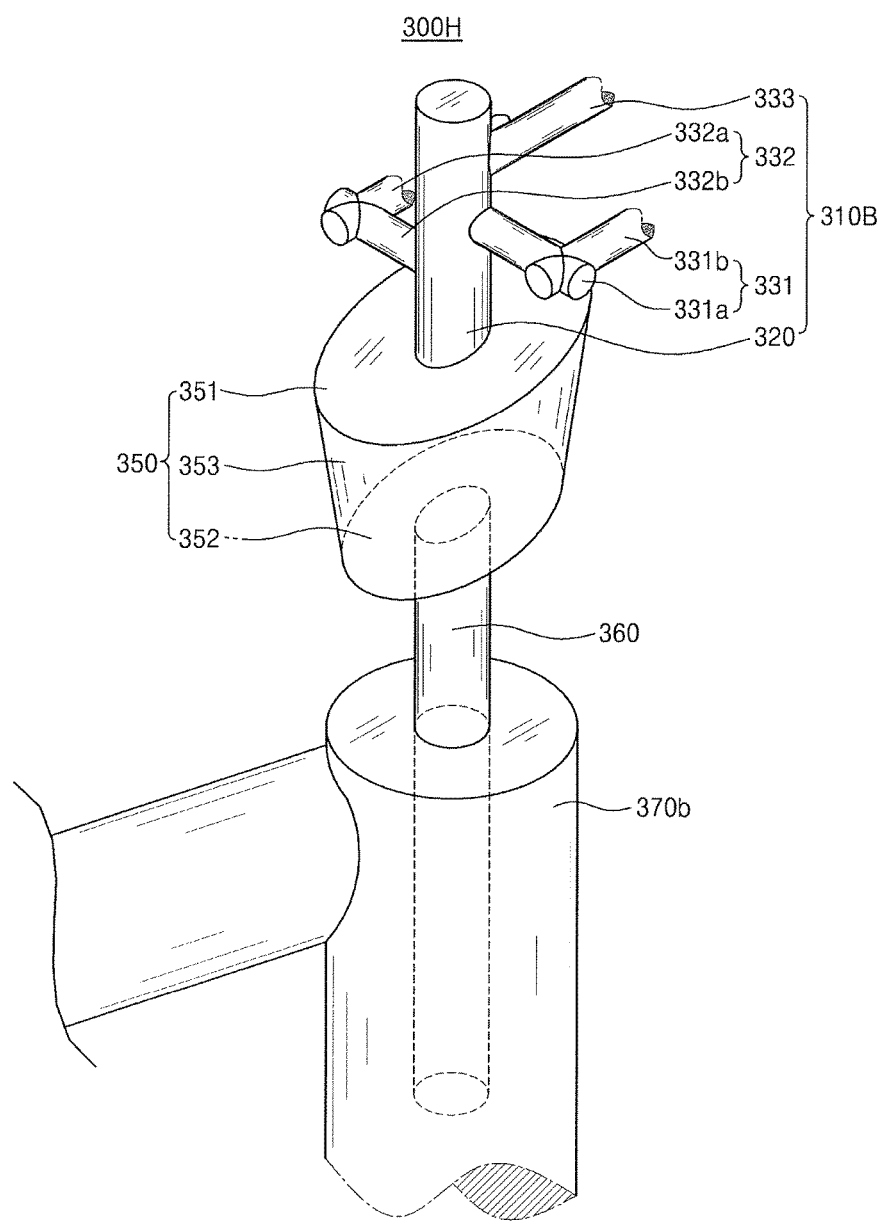

Referring to FIG. 4F, the gas supply unit 300H in accordance with an embodiment may further include the plasma inlet pipe 370b which surrounds the gas outlet pipe 360 compared to the gas supply unit 300B described with reference to FIGS. 3A and 3B.

Figure 5:
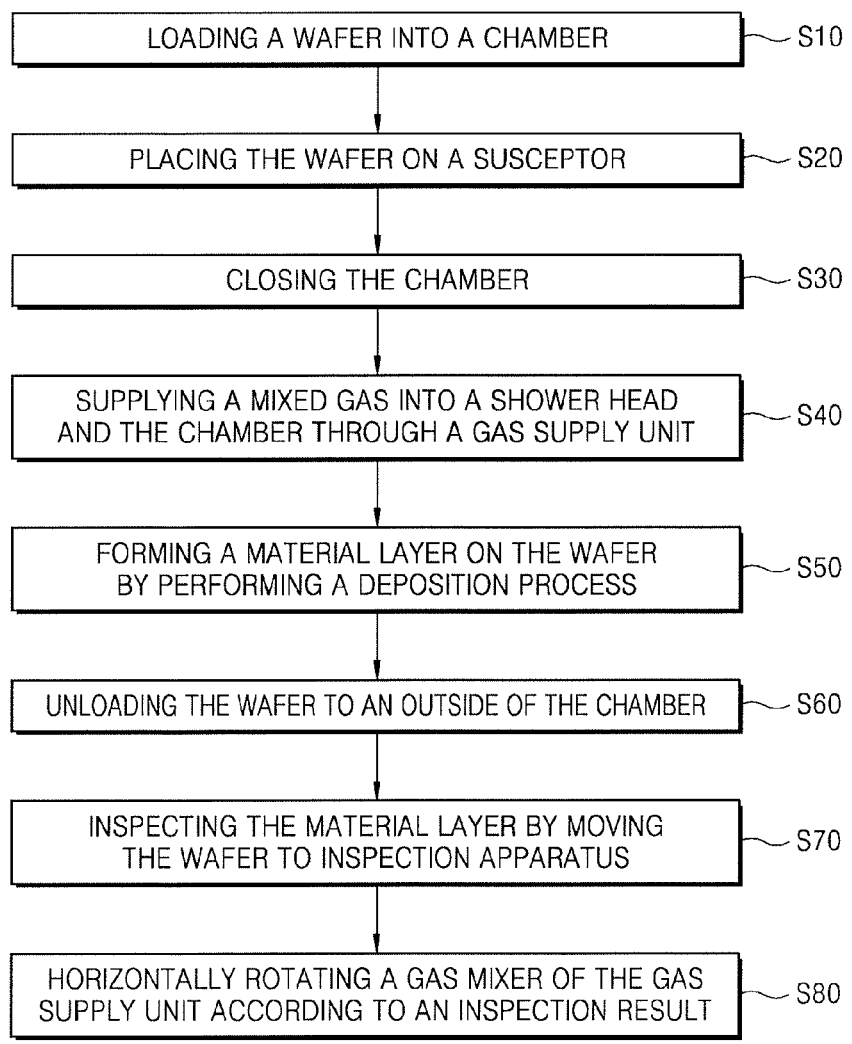
FIG. 5 illustrates a flowchart for conceptually describing a method of performing processes of fabricating a semiconductor device using gas supply units in accordance with various embodiments.

FIG. 5 is a flowchart for conceptually describing a method of performing processes of fabricating a semiconductor device using the gas supply units 300A to 300H in accordance with various embodiments.

Referring to FIGS. 1 and 5, the method of fabricating the semiconductor device in accordance with the embodiment may include loading the wafer W into the chamber 100 (S10), placing the wafer W on the susceptor 150 (S20), closing the chamber 100 (S30), and supplying a mixed gas into the shower head 200 and the chamber 100 through the gas supply unit 300 (S40). The method may include forming a material layer on the wafer W by performing a deposition process (S50). The deposition process may include an atomic layer deposition (ALD) process or a chemical vapor deposition (CVD) process. In an extended embodiment, when a process using plasma is performed, the plasma may be supplied as described with reference to FIGS. 3A to 4F.

The method may include, after the deposition process is completed, unloading the wafer W to the outside of the chamber 100 (S60), and inspecting the material layer by moving the wafer W to an inspection apparatus (S70). The method may further include horizontally rotating the gas mixer 350 of the gas supply unit 300 according to an inspection result (S80). Then, the method may repeat Operations S10 to S80. In some embodiments, inspecting the wafer W (S70) and horizontally rotating the gas mixer 350 (S80) may be selectively performed. In the extended embodiment, the horizontal rotation of the gas mixer 350 (S80) may be individually and simultaneously performed when the mixed gas is supplied (S40) and/or the material layer is formed on the wafer (S50).

According to an embodiment, a gas mixer has an elliptical shape, i.e., upper and lower surfaces of the gas mixer have elliptical shapes with major and minor axes. When the gas mixer rotates horizontally, i.e., around an axis normal to the lower and upper surfaces, an eccentric phenomenon of a non-uniformly mixed gas supplied from the gas mixer to the shower head or the chamber may be prevented or substantially reduced from being generated. As such, a uniformly mixed gas may be supplied into a shower head or a chamber. According to an embodiment, mixing and supplying states of a gas supplied into the shower head or the chamber can be adjusted in real time.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device fabricating apparatus, comprising:
   a gas mixer including:
      an upper surface and a lower surface, each of the upper and lower surfaces having an elliptical plane, and
      a side surface connecting the upper and lower surfaces, a space enclosed by the side surface and the upper and lower surfaces defining an internal volume of the gas mixer to receive gas;
   a gas inlet pipe connected to the upper surface of the gas mixer, an internal volume of the gas inlet pipe being smaller than the internal volume of the gas mixer; and
   a gas outlet pipe connected to the lower surface of the gas mixer, the gas mixer being rotatable with respect to the gas inlet pipe.

2. The apparatus as claimed in claim 1, wherein a maximum diameter of the lower surface of the gas mixer equals a minimum diameter of the upper surface of the gas mixer.

3. The apparatus as claimed in claim 1, wherein the upper surface and the lower surface of the gas mixer have major axes in the same direction, respectively, and minor axes in the same direction, respectively.

4. The apparatus as claimed in claim 1, wherein the gas mixer is horizontally rotatable around an axis extending through the gas inlet pipe or the gas outlet pipe.

5. The apparatus as claimed in claim 1, wherein a vertical height of the gas mixer between the lower and upper surfaces thereof is greater than a minimum diameter of the lower surface thereof and smaller than a maximum diameter of the lower surface thereof.

6. The apparatus as claimed in claim 1, wherein the gas inlet pipe is vertically connected to a center of the elliptical plane of the upper surface of the gas mixer.

7. The apparatus as claimed in claim 1, wherein the gas inlet pipe includes:
   a main gas inlet pipe vertically connected to the upper surface of the gas mixer; and
   a branch gas inlet pipe horizontally connected to a side surface of the main gas inlet pipe.

8. The apparatus as claimed in claim 7, wherein the branch gas inlet pipe includes a first branch gas inlet pipe and a second branch gas inlet pipe connected to the main gas inlet pipe, the first and second branch gas inlet pipes being connected to opposite sides of the main gas inlet pipe to have flows thereof face each other.

9. The apparatus as claimed in claim 8, wherein:
   each of the first branch gas inlet pipe and the second branch gas inlet pipe includes a main branch pipe and an elbow branch pipe,
   the main branch pipe of the first branch gas inlet pipe and the main branch pipe of the second branch gas inlet pipe are parallel to each other, and
   the elbow branch pipe of the first branch gas inlet pipe and the elbow branch pipe of the second branch gas inlet pipe face each other.

10. The apparatus as claimed in claim 8, wherein the branch gas inlet pipe further includes a third branch gas inlet pipe connected to the main gas inlet pipe so as to be perpendicular to each of the first branch gas inlet pipe and the second branch gas inlet pipe.

11. The apparatus as claimed in claim 1, wherein the gas inlet pipe includes a vertical branch inlet pipe connected to an upper portion of the main gas inlet pipe.

12. The apparatus as claimed in claim 11, wherein the vertical branch inlet pipe is connected to an external plasma generator.

13. The apparatus as claimed in claim 1, wherein the gas outlet pipe is vertically connected to the lower surface of the gas mixer.

14. The apparatus as claimed in claim 1, further comprising a plasma inlet pipe surrounding the gas outlet pipe.

15. The apparatus as claimed in claim 14, wherein the plasma inlet pipe further surrounds the gas inlet pipe.

16. A semiconductor device fabricating apparatus, comprising:
    a gas mixer including:
        an upper surface and a lower surface, each of the upper and lower surfaces having an elliptical shape in top view, and
        a side surface connecting the upper and lower surfaces;
    a gas inlet pipe connected to the upper surface of the gas mixer; and
    a gas outlet pipe connected to the lower surface of the gas mixer,
    wherein the side surface with the upper and lower surfaces of the gas mixer are rotatable around the gas inlet pipe.

17. The apparatus as claimed in claim 16, wherein the upper surface of the gas mixer is larger than the lower surface of the gas mixer, and the side surface is inclined between the upper and lower surfaces.

18. The apparatus as claimed in claim 16, wherein the gas inlet pipe is external and vertical with respect to the upper surface of the gas mixer, and the gas inlet pipe is connected to a center of the upper surface of the gas mixer.

\* \* \* \* \*